(12) United States Patent
Amasaki et al.

(10) Patent No.: US 10,164,452 B2
(45) Date of Patent: Dec. 25, 2018

(54) BATTERY PACK AND METHOD FOR CONTROLLING DISCHARGE OF SECONDARY CELL

(71) Applicant: Sanyo Electric Co., Ltd., Osaka (JP)

(72) Inventors: Hisanori Amasaki, Hyogo (JP); Naoto Matsuda, Hyogo (JP); Hisashi Kameyama, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 359 days.

(21) Appl. No.: 14/787,152

(22) PCT Filed: May 13, 2014

(86) PCT No.: PCT/JP2014/002511
§ 371 (c)(1),
(2) Date: Oct. 26, 2015

(87) PCT Pub. No.: WO2014/185053
PCT Pub. Date: Nov. 20, 2014

(65) Prior Publication Data
US 2016/0079788 A1 Mar. 17, 2016

(30) Foreign Application Priority Data

May 17, 2013 (JP) ................. 2013-104593
May 17, 2013 (JP) ................. 2013-104594

(51) Int. Cl.
*H02J 7/00* (2006.01)
*H01M 10/42* (2006.01)
*G01R 31/36* (2006.01)

(52) U.S. Cl.
CPC ........ *H02J 7/0063* (2013.01); *G01R 31/3624* (2013.01); *H01M 10/425* (2013.01);
(Continued)

(58) Field of Classification Search
CPC .................................................. H02J 7/0063
(Continued)

(56) References Cited

U.S. PATENT DOCUMENTS 4,672,555 A * 6/1987 Hart ....................... G01R 19/25
324/142
6,506,997 B2 * 1/2003 Matsuyama ......... B23K 11/252
219/109
(Continued)

FOREIGN PATENT DOCUMENTS

JP 10-260236 9/1998
JP 2001-110459 4/2001
(Continued)

OTHER PUBLICATIONS

International Search Report of PCT application No. PCT/JP2014/002511 dated Jun. 24, 2014.

*Primary Examiner* — Drew A Dunn
*Assistant Examiner* — Jerry D Robbins
(74) *Attorney, Agent, or Firm* — Wenderoth, Lind & Ponack, L.L.P.

(57) ABSTRACT

The battery pack including a battery group in which a plurality of secondary batteries are connected in series; a detector that detects a charging and discharging current value flowing in the battery group and a voltage value of the battery group in a time-division manner by switching between the current value and the voltage value using an electronic circuit; and a controller/operator that performs operation and control using the current value and the voltage value detected by the detector. In the battery pack, the detector detects current values before and after the voltage value of the battery group is detected, and the controller/operator determines that the voltage value of the battery group is influenced by the peak discharge power when at
(Continued)

least one of the current values exceeds a predetermined threshold.

4 Claims, 5 Drawing Sheets

(52) U.S. Cl.
CPC ... *H02J 7/0021* (2013.01); *H01M 2010/4271* (2013.01); *H01M 2220/30* (2013.01)

(58) Field of Classification Search
USPC .......................................................... 320/136
See application file for complete search history.

(56) References Cited

U.S. PATENT DOCUMENTS

| | | | | |
|---|---|---|---|---|
| 2003/0164644 A1* | 9/2003 | Sasaki | ..................... | H02J 7/345 307/5 |
| 2010/0085010 A1* | 4/2010 | Suzuki | ..................... | B25F 5/00 320/132 |
| 2012/0235483 A1* | 9/2012 | Rigby | ................. | H01M 10/482 307/29 |

FOREIGN PATENT DOCUMENTS

| JP | 2003-250228 | 9/2003 |
|---|---|---|
| JP | 2006-138750 | 6/2006 |
| JP | 2007-240234 | 9/2007 |

\* cited by examiner

BATTERY PACK AND METHOD FOR CONTROLLING DISCHARGE OF SECONDARY CELL

CROSS-REFERENCE TO RELATED APPLICATIONS

This application is a U.S. national stage application of the PCT International Application No. PCT/JP2014/002511 filed on May 13, 2014, which claims the benefit of foreign priority of Japanese patent applications 2013-104593 filed on May 17, 2013 and 2013-104594 filed on May 17, 2013, the contents all of which are incorporated herein by reference.

TECHNICAL FIELD

The present invention relates to a battery pack that supplies power to an electronic device which instantaneously improves a processing speed with peak discharge power higher than power in a usual state, and a method for controlling discharge of a secondary battery.

BACKGROUND ART

A conventional battery pack described in PTL 1 includes a battery group in which a plurality of secondary batteries are connected in series, current/voltage detector 4 that detects a voltage corresponding to a charging and discharging current flowing in the battery group and a voltage at each secondary battery in a time-division manner by switching the voltages with a multiplexer, and a controller/operator that acquires and operates the voltages detected by current/voltage detector 4. At this point, the voltage at each secondary battery and the voltage corresponding to the current are sequentially measured.

CITATION LIST

Patent Literature

PTL 1: Unexamined Japanese Patent Publication No. 2007-240234

SUMMARY OF THE INVENTION

Recently, an electronic device such as a portable Personal Computer (PC) has a function of instantaneously enhancing a processing speed of a Central Processing Unit (CPU). When the electronic device uses the function, the battery pack instantaneously increases peak power by a pulse discharge for several milliseconds. The function is particularly effective in a scene, such as video editing and a 3D game, in which high-speed processing of the CPU is required.

The voltage at the secondary battery cell is temporarily decreased in performing the pulse discharge, and the voltage at the secondary battery cell is recovered after the pulse discharge. In such cases, when a remaining capacity is corrected while the voltage at the secondary battery cell is decreased lower than a predetermined low voltage, sometimes the remaining capacity is not the proper remaining capacity but instead the remaining capacity is the corrected low capacity despite the voltage at the secondary battery being recovered.

Sometimes the discharge is stopped when the voltage at the secondary battery cell is decreased lower than or equal to a discharge stopping voltage (predetermined voltage) during the pulse discharge, and a microcomputer of the battery pack is shut down when the voltage at the secondary battery cell is lower than or equal to a shutdown voltage.

The present invention is made in order to solve the drawback. An object of the present invention is to provide a battery pack that can calculate and operate the voltage at the secondary battery cell during the peak discharge (pulse discharge).

According to one aspect of the present invention, a battery pack that supplies power to an electronic device, the electronic device improving instantaneously a processing speed with peak discharge power higher than power in a usual state, the battery pack includes: a battery group in which a plurality of secondary batteries are connected in series; a detector that detects a charging and discharging current value flowing in the battery group and a voltage value of the battery group in a time-division manner by switching between the current value and the voltage value using an electronic circuit; and a controller/operator that performs operation and control using the current value and the voltage value detected by the detector. In the battery pack, the detector detects current values before and after the voltage value of the battery group is detected, and the controller/operator determines that the voltage value of the battery group is influenced by the peak discharge power when at least one of the current values exceeds a predetermined threshold.

According to another aspect of the present invention, a method for controlling discharge of a secondary battery that supplies power to an electronic device, the electronic device improving instantaneously a processing speed with peak discharge power higher than power in a usual state, the method includes: detecting a charging and discharging current value flowing in a battery group and a voltage value of the battery group in a time-division manner by switching between the current value and the voltage value using an electronic circuit, the battery group having a plurality of secondary batteries connected in series; and detecting current values before and after the voltage value of the battery group is detected, and determining that the voltage value of the battery group is influenced by the peak discharge power when at least one of the current values exceeds a predetermined threshold.

In the battery pack of the present invention, the change in voltage and the change in current value of the secondary battery cell are continuously detected by detecting the current values before and after the voltage at each secondary battery cell is detected, which allows the generation of the pulse discharge to be properly detected. Additionally, the voltage of the secondary battery cell can be calculated and operated during the peak discharge power (pulse discharge). Therefore, in the pulse discharge power, the voltage at the secondary battery cell does not drop to below the predetermined low voltage to be corrected, the discharge stopping voltage, and the shutdown voltage.

DESCRIPTION OF EMBODIMENTS

First Exemplary Embodiment

A first exemplary embodiment of the present invention will be described below with reference to the drawings.

Figure 1:
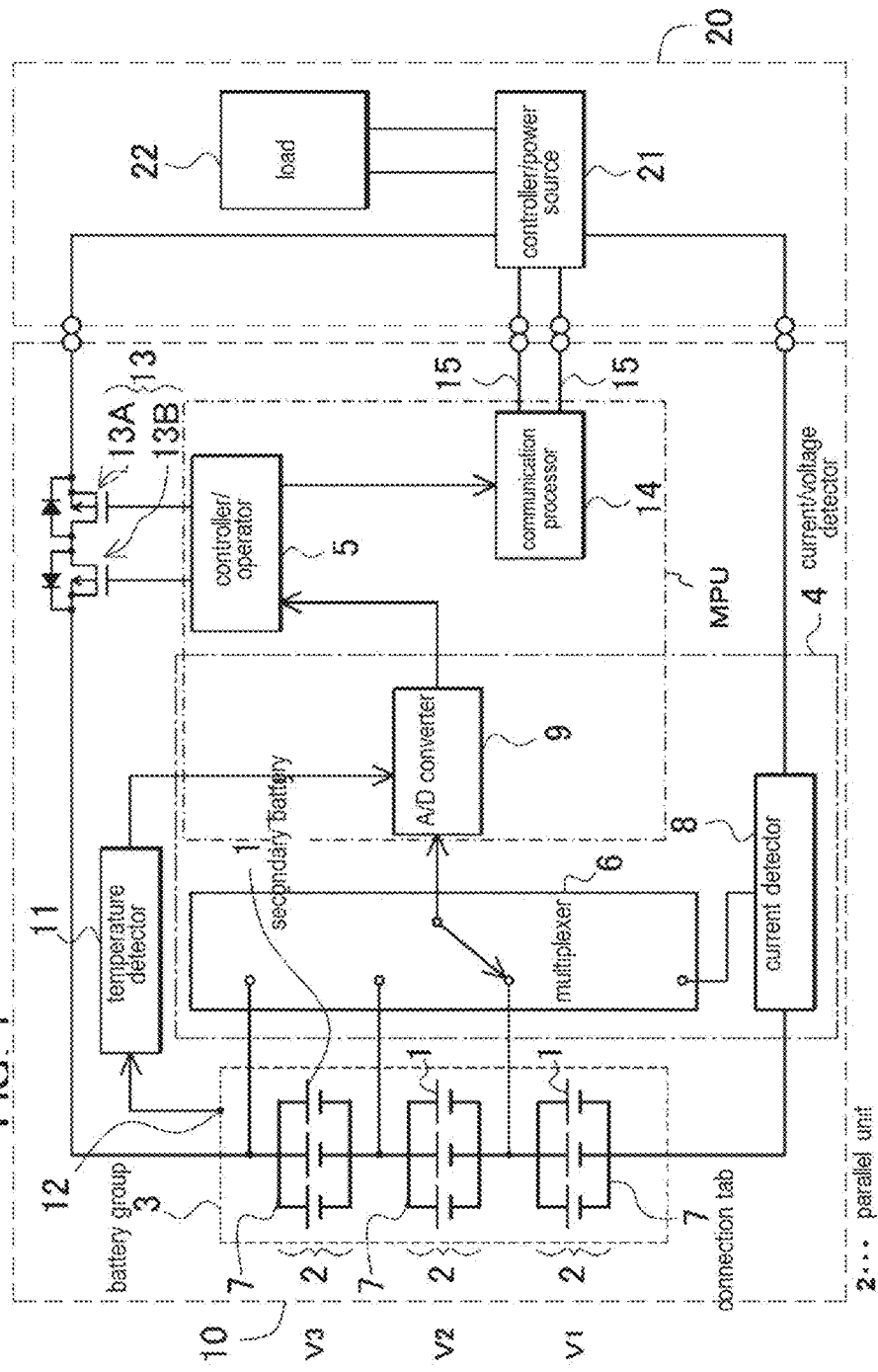
FIG. 1 is a schematic configuration diagram illustrating a battery pack according to first and second exemplary embodiments of the present invention.

Battery pack 10 in FIG. 1 is detachably set in mobile device 20, such as a portable PC, which is of an electronic device provided with a power source used to charge battery pack 10. The portable PC is a notebook type of portable personal computer. A power source adapter (not illustrated) that converts AC commercial power from an outlet into DC power is connected to mobile device 20. The power source adapter supplies the DC power to mobile device 20.

Mobile device 20 includes a controller/power source 21 provided with a microcomputer that controls the supplied power. Controller/power source 21 outputs the power to battery pack 10, and also supplies the power to load 22 of mobile device 20. In the case that the power is not supplied from the power source adapter, the power is supplied from battery pack 10 to mobile device 20.

Nowadays, a portable Personal Computer (PC) has a function of instantaneously enhancing a processing speed of a Central Processing Unit (CPU). When the electronic device uses the function, the battery pack instantaneously increases peak power by pulse discharge for several milliseconds. The function is particularly effective in a scene, such as video editing and a 3D game, in which high-speed processing of the CPU is required.

In battery pack 10 of FIG. 1, a plurality of secondary batteries 1 are connected in parallel to constitute parallel unit 2. A plurality of parallel units 2 are connected in series to constitute battery group 3. The battery pack includes current/voltage detector 4 that detects a charging and discharging current flowing in battery group 3 and a voltage of each parallel unit 2, and controller/operator 5 provided with a microcomputer that performs control and operation from the current and voltage detected by current/voltage detector 4.

Secondary battery 1 of parallel unit 2 is a lithium ion battery. In battery pack 10 of FIG. 1, three secondary batteries 1 are connected in parallel as parallel unit 2. However, in battery pack 10 of the present invention, two secondary batteries 1 can be connected in parallel as parallel unit 2, or at least four secondary batteries 1 can be connected in parallel. Parallel units 2 are connected in parallel through connection tab 7 that is of a metallic plate or a lead wire.

Battery pack 10 includes current detector 8 that detects the current of battery group 3. Battery pack 10 also includes multiplexer 6 and a Micro Processor Unit (hereinafter, referred to as an MPU). Multiplexer 6 is an electronic circuit of current/voltage detector 4 and switches between a voltage signal corresponding to an input current and a battery voltage signal at a predetermined sampling period, to output the signals. The MPU monitors and controls charging and discharging of secondary battery 1 by using data output from multiplexer 6. The MPU includes A/D converter 9 that converts an analog signal into a digital signal to output the digital signal to controller/operator 5.

Although not illustrated, current detector 8 includes a current detection resistor that is connected in series with battery group 3 and an amplifier that amplifies the voltage at both ends of the current detection resistor. An output voltage of the amplifier is proportional to the current flowing in battery group 3. Accordingly, the battery current can be detected from the output voltage of the amplifier. The charging current and discharge current flow in the battery in directions opposite to each other, positive and negative polarities of the output voltage of the amplifier are opposite in the charging current and the discharge current. In the amplifier, when the discharge current is the positive output voltage, the charging current is the negative output voltage. Accordingly, the charging current and the discharge current can be distinguished from each other by the positive or negative signal output from the amplifier.

As illustrated in FIG. 1, battery pack 10 includes temperature detector 11 that detects a battery temperature. Temperature detector 11 includes temperature sensor 12, such as a thermistor, which is provided close to the battery. Temperature detector 11 also includes a temperature-voltage conversion circuit that converts a change in electric resistance of temperature sensor 12 into a change in voltage. The signal output from the temperature-voltage conversion circuit is input to multiplexer 6, and the battery temperature is detected from controller/operator 5.

Multiplexer 6 sequentially switches among a current signal output from current detector 8, a voltage signal of each parallel unit 2, and the signal output from the temperature-voltage conversion circuit, to output the signals to A/D converter 9. As illustrated in FIG. 1, in battery pack 10, three sets of parallel units 2 are connected in series. Accordingly, multiplexer 6 sequentially switches among the current signal of current detector 8 and the voltage signals of the three sets of parallel units 2 at a predetermined sampling period, to output the signals to A/D converter 9. Multiplexer 6 switches among the 1-channel current signal, 3-channel voltage signal of secondary battery 1, 1-channel battery total voltage signal, 1-channel signal output from the temperature-voltage conversion circuit.

As to the signal from current detector 8, an A/D converter (not illustrated) is provided independently of A/D converter 9, and an output of the A/D converter is transmitted to controller/operator 5, which allows a current value to be correctly detected to integrate a capacity.

Multiplexer 6 switches the inputs of the plurality of channels at a sampling period of 250 ms, to output the inputs to A/D converter 9. The changes in current, temperature, and voltage of the battery can quickly be detected by shortening the sampling period. On the other hand, component cost can be reduced by lengthening the sampling period. Accordingly, the sampling period of multiplexer 6 is set to the above-described range in consideration of the component cost and the changing state of the current or voltage.

A/D converter 9 converts the analog signal input from multiplexer 6 into the digital signal, and outputs the digital signal. A/D converter 9 converts the input analog signal into the digital signal in synchronization with the time multiplexer 6 switches between the inputs. Accordingly, every time multiplexer 6 switches between the inputs, A/D converter 9 converts the input analog signal into the digital signal, and outputs the digital signal. The operation, in which A/D converter 9 converts the input signal into the digital signal after multiplexer 6 switches between the inputs, is repeated to convert the input signal into the digital signal.

The output of A/D converter 9 is input to controller/operator 5. The digital signal input from A/D converter 9 to controller/operator 5 is a current signal indicating a current value of the charging and discharging current flowing in battery group 3 and a voltage signal that is of the voltage on the positive side of parallel unit 2. In battery pack 10 that detects a temperature signal, a temperature signal indicating the temperature of battery group 3 is also output in addition to the digital signal. These signals are input to controller/operator 5 at the sampling periods of multiplexer 6 and A/D converter 9. Controller/operator 5 operates the input signals to perform control.

Controller/operator 5 integrates the charging and discharging current of battery group 3 to perform operation processing on a remaining capacity, detects full charging of battery group 3 from the charging current or voltage, and detects an abnormal current, an abnormal temperature, and an abnormal voltage, thereby controlling the charging and discharging. Controller/operator 5 performs on/off control on control element 13 constructed with a switching transistor and the like, and control element 13 is turned off to interrupt the current during the detection of the abnormal current, the abnormal temperature, and the abnormal voltage.

Controller/operator 5 integrates a value in which the charging and discharging current converted by A/D converter 9 is multiplied by the sampling period (for example, 250 ms), subtracts an integrated amount from the full charging during the discharge, or adds the integrated amount to the remaining capacity at a beginning of the charging. The remaining capacity of battery group 3 is calculated through the operation.

In battery pack 10 in which the lithium ion battery is used as secondary battery 1, using constant current (maximum current of about 0.5 C to about 1 C)/constant voltage (maximum of about 4.2 V/parallel unit) charging in which the current and the voltage are controlled, a determination of the full charging is made when the voltage at parallel unit 2 is greater than or equal to a predetermined value and when the charging current is less than or equal to a predetermined value. When detecting the full charging of the battery, controller/operator 5 turns off charging control element 13 to stop the charging, and causes communication processor 14 to output the information indicating the remaining capacity of 100%. The full charging information is transmitted to mobile device 20 through communication line 15. Additionally, various pieces of are output from communication processor 14, and input to communication processor 14.

In battery pack 10 of FIG. 1, charging FET 13A and discharge FET 13B that are of a P-channel FET are connected in series with battery group 3 as control element 13. A "high" voltage is input to the P-channel FET, thereby turning off the P-channel FET. In the case that the lithium ion battery is used as secondary battery 1, battery pack 10 performs the control so as to turn off charging FET 13A when the voltage at one of parallel units 2 is greater than or equal to an overcharge voltage of the lithium ion battery, for example, 4.2 V. At this point, controller/operator 5 inputs the "high" voltage that is of an off signal to a gate of charging FET 13A. The discharge current can flow in charging FET 13A in an off state by the parasitic diode. Accordingly, the battery can be discharged in the off state of charging FET 13A. At this point, when the battery is discharged to decrease the voltage by mobile device 20, charging FET 13A is turned on.

Battery pack 10 performs the control so as to turn off discharge FET 13B when the battery voltage at one of parallel units 2 is less than or equal to the over-discharge voltage (discharge stopping voltage) of the lithium ion battery, for example, 3.2 V. At this point, controller/operator 5 inputs the "high" voltage that is of the off signal to the gate of discharge FET 13B. The charging current can flow in discharge FET 13B in the off state by the parasitic diode. Accordingly, the battery can be charged in the off state of discharge FET 13B. At this point, when the battery is charged by mobile device 20 to increase the voltage, discharge FET 13B is turned on.

In battery pack 10, the microcomputer of controller/operator 5 is shut down when the battery voltage at one of parallel units 2 is less than or equal to a shutdown voltage, for example, 3.0 V.

When the lithium ion battery is greater than or equal to the over-discharge voltage, the discharge progresses, and controller/operator 5 corrects a remaining amount in response to the voltage signal input from A/D converter 9. When the signal indicating that the voltage at secondary battery 1 is decreased to reach a first voltage is input from A/D converter 9, controller/operator 5 corrects a calculated remaining capacity ratio using first remaining capacity (ratio) Ya1 (for example, 8%) that is previously set according to the first voltage (for example, the lithium ion battery of 3.4 V/cell (in the voltage at the lowest battery cell when the plurality of battery cells exist)).

When the battery voltage at secondary battery 1 reaches the battery voltage (predetermined low voltage) corresponding to a predetermined remaining capacity (for example, 8%), a learning capacity can be obtained by dividing the capacity discharged from the full charging by a predetermined value (1-predetermined remaining capacity value, 0.92 in this case).

That is, assuming that first remaining capacity Ya1 is the predetermined remaining capacity of 8%, when the calculated remaining capacity becomes 9%, controller/operator 5 holds 9% as the remaining capacity until the battery voltage at secondary battery 1 is decreased to first voltage V1. On the other hand, in the case that the calculated remaining capacity is greater than or equal to 9%, when the battery voltage at secondary battery 1 is decreased to first voltage V1, controller/operator 5 corrects the calculated remaining capacity to 8%.

When the signal indicating that the voltage at secondary battery 1 is decreased to a predetermined discharge stopping voltage is input with the progress of the discharge, controller/operator 5 corrects the calculated remaining capacity to zero. This is because the actual capacity of secondary battery 1 becomes zero as a lower limit capacity when the battery voltage is decreased to the discharge stopping voltage. Controller/operator 5 operates and stores a discharge current integration amount from the starting of the discharge to the discharge stopping voltage as a total discharge amount (=total capacity).

Figure 2:
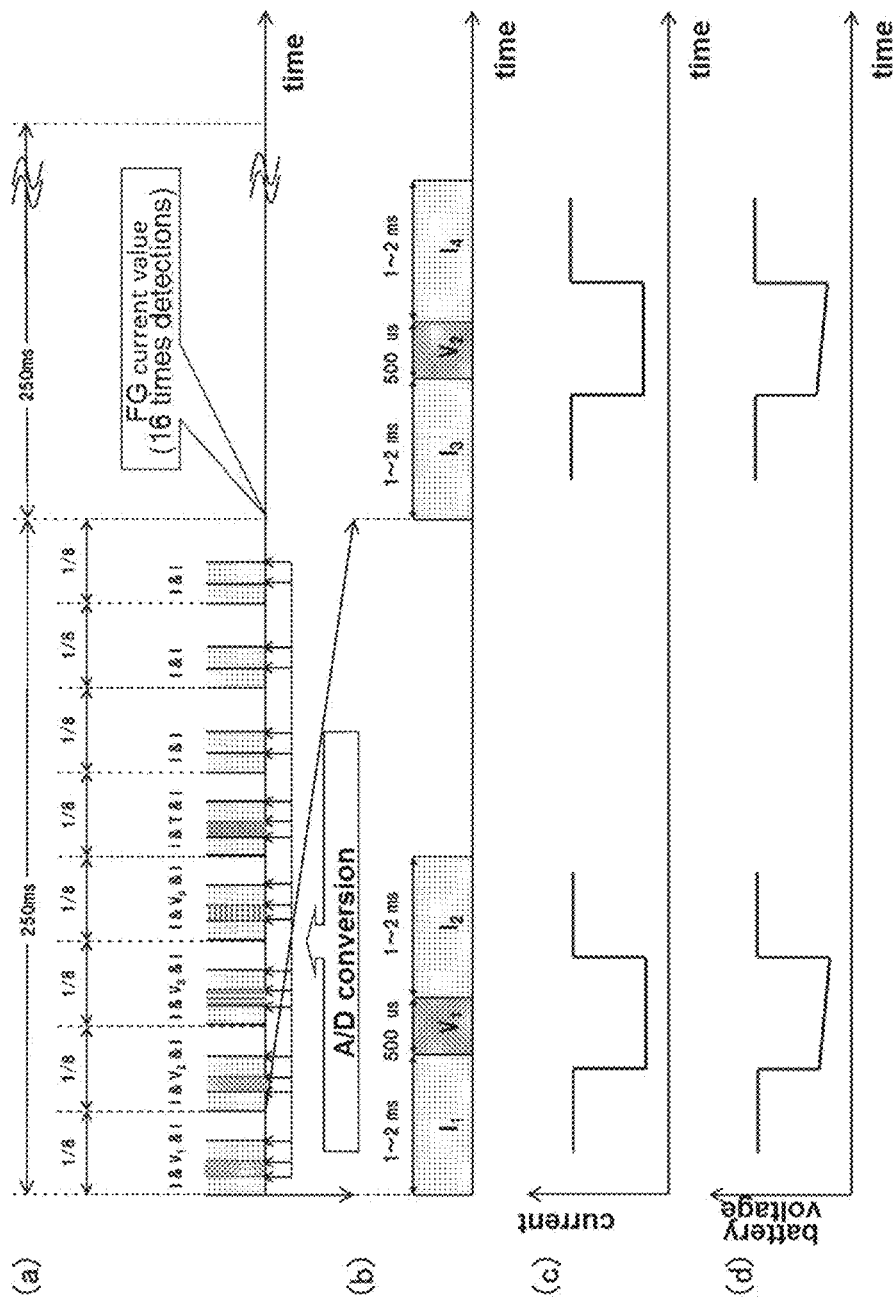
FIG. 2 is a view illustrating timing at which an A/D converted value is acquired, of the battery pack according to the first and second exemplary embodiments of the present invention.

FIG. 2(*a*) is a view illustrating the timing at which an A/D converted value is acquired, FIG. 2(*b*) is an enlarged view of FIG. 2(*a*), FIG. 2(*c*) is a graph illustrating a current of pulse discharge corresponding to a temporal axis in FIG. 2(*b*), and FIG. 2(*d*) is a graph of a voltage of the pulse discharge corresponding to the temporal axis in FIG. 2(*b*).

In the first exemplary embodiment, the microcomputer of controller/operator 5 runs a control/operation program at a period of 250 ms.

As illustrated in FIGS. 2(*a*) and 2(*b*), at a predetermined time interval (about 30 ms) which is formed by dividing the period of 250 ms into eight sections, current values are detected from the beginning of the period of 250 ms before and after the voltage at the secondary battery cell is detected. That is, the current value is detected in current measuring time interval I1 (1 ms to 2 ms), the voltage is detected in voltage measuring time interval V1 (1 μs (minimum measuring period)), and the current value is detected in current measuring time interval 12 (1 ms to 2 ms). At the end of each measuring time interval which is formed by dividing the period of 250 ms into eight sections as illustrated in FIG. 2(*a*), the converted digital value is input to, received by, and detected by controller/operator 5. Voltages V2 and V3 at parallel units 2 are also measured, and a total voltage at secondary battery 1, namely, voltage Vp at battery group 3 are detected. Then, the current, the temperature, and the current are detected. Then, the current is detected twice in each of the three continuous time intervals each of which is formed by dividing the period of 250 ms into eight sections. The measuring time interval of multiplexer 6 is about 0.5 ms at a minimum, ranges normally from 1 ms to 2 ms, and also can range from about 0.5 ms to about 20 ms.

As illustrated in FIGS. 2(*c*) and 2(*d*), the current and the voltage vary by the pulse discharge (several milliseconds to 10 ms). The discharge current is discharged to mobile device 20 by the pulse discharge. At this point, because of a voltage drop by, particularly an internal resistance of secondary battery 1, the battery voltage in FIG. 2(*d*) drops largely to stop the discharge current, thereby recovering the battery voltage.

In the first exemplary embodiment, the change in voltage at each parallel unit 2 and the change in current value are continuously detected with respect to the pulse discharge having the pulse discharge time of several milliseconds to 30 ms (for example, about 10 ms) by detecting the current values before and after the voltage at each battery group is detected, which allows the generation of the pulse discharge to be properly detected.

As illustrated in FIG. 2(*a*), the current is detected 16 times, these detected values are averaged as the current value, and controller/operator 5 integrates the charging and discharging current of battery group 3 to operate the remaining capacity as described above.

In the measurement and detection of the first exemplary embodiment, the control is performed as follows.

In the case that the current values are detected before and after the voltage at each parallel unit 2 is detected, a determination that the pulse (peak) discharge exists is made when the current value exceeds a predetermined threshold (for example, 2 C).

A determination that the pulse (peak) discharge does not exist is made when the current value is less than or equal to the predetermined threshold (for example, 2 C), and battery voltage Vnormal in a usual state, which is not influenced by peak discharge (to be described later), is measured and operated.

Figure 3:
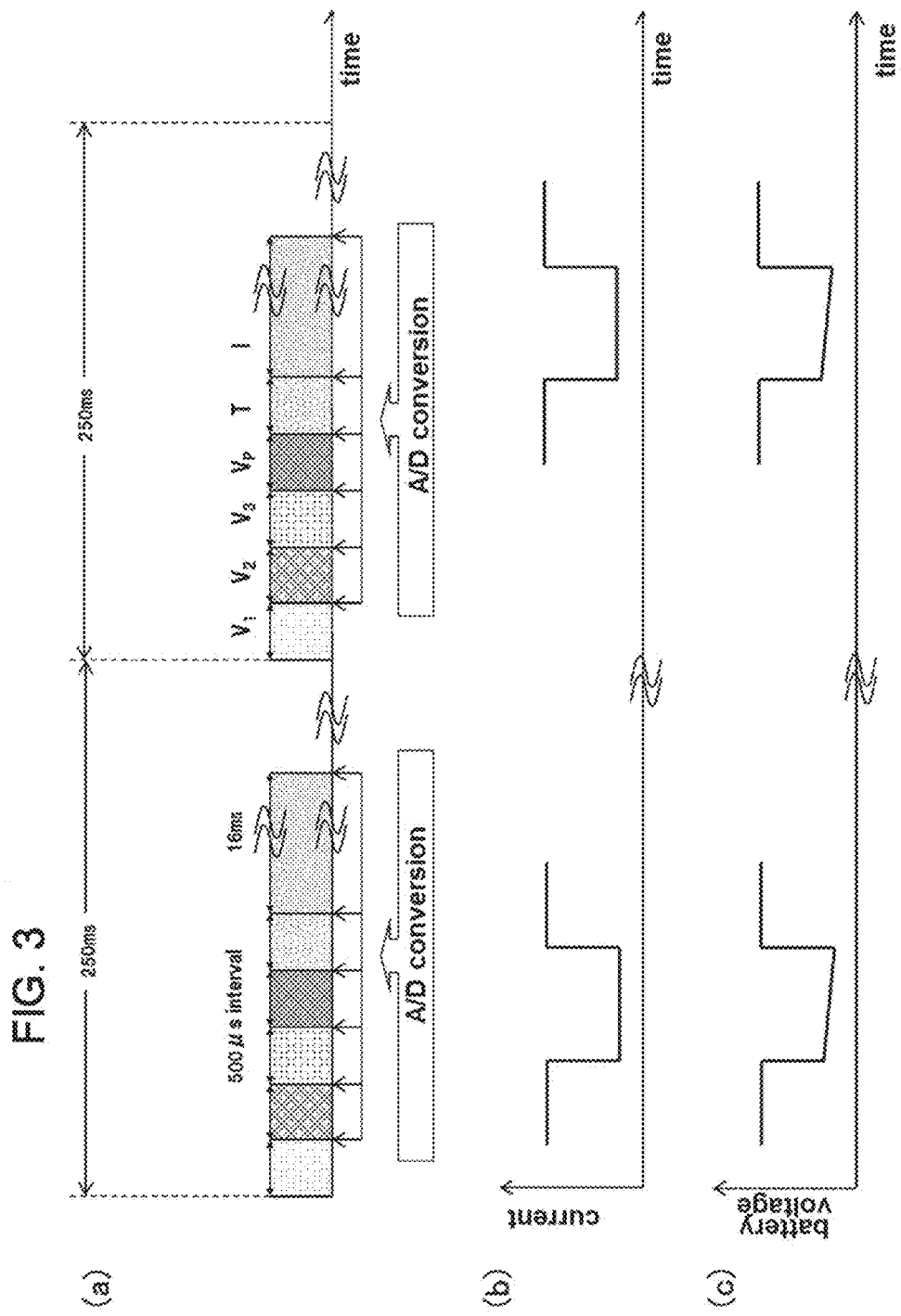
FIG. 3 is another view illustrating timing at which an A/D converted value is acquired, of the battery pack according to the first and second exemplary embodiments of the present invention.

The current and the voltage may be measured as follows. As illustrated in FIG. 3(*a*), in the period of 250 ms, the voltage at each parallel unit 2 is continuously detected four times (about 0.5 ms/time) (V1, V2, V3, and total voltage Vp), a temperature signal voltage is detected one time (about 0.5 ms/time), and the voltage corresponding to the current is detected one time (about 16 ms/time).

As illustrated in FIGS. 3(*b*) and 3(*c*), when a difference voltage between the previously-measured voltage and the voltage measured at that time is less than or equal to a predetermined voltage value (for example, 1 V) in the battery voltage measurement, or when a different current between the previously-measured current and the current measured at that time is less than or equal to a predetermined value (for example, 1 C) in the current measurement, the determination that the pulse (peak) discharge does not exist is made, and battery voltage Vnormal that is not influenced by the peak discharge is measured and operated.

Figure 4:
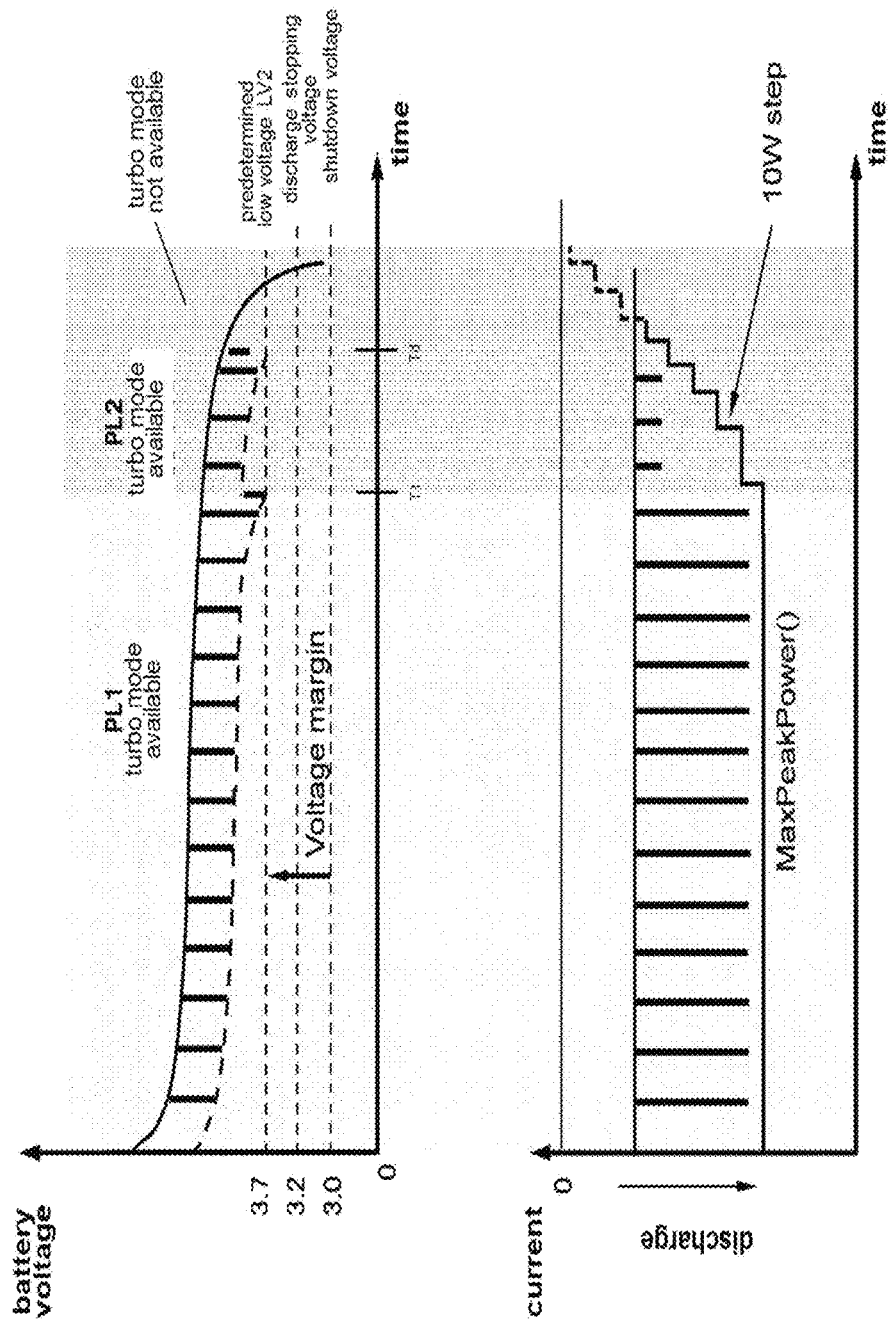
FIG. 4 is a view illustrating a voltage and a current during discharge of the battery pack according to the first exemplary embodiment of the present invention.

Referring to FIG. 4, in mobile device 20 driven by the power from battery pack 10, the voltage and the current of the battery cell having the lowest voltage in battery pack 10 are expressed during the discharge when the CPU incorporated in mobile device 20 uses the function of instantaneously enhancing the processing speed. The supply from commercial power is eliminated after the full charging, and mobile device 20 is driven by the power from battery pack 10.

When the pulse discharge is performed during the discharge, there is a possibility that the voltage value of battery group 3 is decreased less than or equal to the predetermined low voltage (3.4 V/cell) to be corrected, the discharge stopping voltage (3.2 V), and the shutdown voltage (3.0 V). However, it is undesirable that the voltage value of the battery group 3 is decreased less than or equal to the predetermined low voltage, the discharge stopping voltage, and the shutdown voltage.

In the first exemplary embodiment of the present invention, the measurement, the calculation, and the determination are made in parallel unit 2 having the lowest voltage in battery pack 10, thereby performing the discharge control. Battery voltage Vnormal that is not influenced by the peak discharge is measured. At this point, initial discharge current $I_0$ is calculated from Mathematical formula 1 using maximum peak discharge power Pmax, and voltage drop $\Delta V_0$ by internal resistance R of secondary battery 1 is calculated from Mathematical formula 2. Discharge current $I_k$ during the next peak discharge is calculated from Mathematical formula 3, and discharge current $I_k$ and voltage drop $\Delta V_k$ by internal resistance R are calculated from Mathematical formula 4. Output voltage Vout during the next peak discharge is calculated from Mathematical formula 5 to determine whether output voltage Vout is larger than a predetermined value.

$$I_0 = P\text{max}/V\text{normal} \qquad \text{(Mathematical formula 1)}$$

$$\Delta V_0 = I_0 \times R \qquad \text{(Mathematical formula 2)}$$

$$I_k = P\text{max}/(V\text{normal} - \Delta V_{k-1}) \ (k=1,2,\ldots,n) \qquad \text{(Mathematical formula 3)}$$

$$\Delta V_k = I_k \times R \ (k=1,2,\ldots,n) \qquad \text{(Mathematical formula 4)}$$

$$V\text{out} = V\text{normal} - \Delta V n \qquad \text{(Mathematical formula 5)}$$

When output voltage Vout during the next peak discharge is determined to be smaller than the predetermined value, the next peak discharge is controlled. For example, controller/operator 5 transmits the signal to mobile device 20 through communication processor 14 to stop the peak discharge.

As illustrated in FIG. 4, after the voltage measurement at time T1, output voltage Vout during the next peak discharge is determined to be larger than the predetermined value, and controller/operator 5 transmits the signal issuing an instruction to decrease the peak discharge power to mobile device 20 through communication processor 14, whereby consumed power of mobile device 20 is decreased to decrease the peak discharge power. Since the peak discharge power is decreased to decrease the peak discharge power at time Td, even if the peak discharge is performed, the battery voltage is not decreased less than or equal to the predetermined low voltage (3.4 V/cell, LV2 Voltage in FIG. 4) to be corrected, the discharge stopping voltage (3.2 V, EndVoltage in FIG. 4), and the shutdown voltage (3.0 V, system shutdown in FIG. 4). Therefore, the false correction of the remaining capacity, the false stopping of the discharge, or the false shutdown is not performed. When output voltage Vout during the next peak discharge is determined to be larger than the predetermined value, the next peak discharge is performed.

Other exemplary embodiments of the present invention will be described below. In mobile device 20 driven by the power from battery pack 10, the supply from the commercial power is connected to the power source adapter, and battery pack 10 is charged while mobile device 20 is driven. At this point, when the CPU incorporated in mobile device 20 uses the function of instantaneously enhancing the processing speed, the pulse discharge power is supplied from battery pack 10 to mobile device 20 because the large pulse discharge power is consumed to enhance the processing speed.

When the pulse discharge is performed while battery pack 10 is charged from the small remaining capacity (battery voltage), sometimes the battery voltage is decreased less than or equal to the predetermined low voltage (3.4 V/cell) to be corrected, the discharge stopping voltage (3.2 V), and the shutdown voltage (3.0 V).

In the first exemplary embodiment of the present invention, the measurement, the calculation, and the determination are made in parallel unit 2 having the lowest voltage in battery pack 10, thereby performing the discharge control. Battery voltage Vnormal that is not influenced by the peak discharge is measured. At this point, using maximum peak discharge power Pmax (Pmax is updated while the cell voltage is always monitored by the following method. An initial value of Pmax is, for example, 100 W, but Pmax is immediately updated by the voltage at parallel unit 2 with a step of, for example, 10 W) and power increase Pstep, initial discharge current $I_0$ is calculated from Mathematical formula 6, and voltage drop $\Delta V_0$ by internal resistance R of secondary battery 1 is calculated from Mathematical formula 7. Discharge current $I_k$ during the next peak discharge is calculated from Mathematical formula 8, and discharge current $I_k$ and voltage drop $\Delta V_k$ by internal resistance R are calculated from Mathematical formula 9. Output voltage Vout during the next peak discharge is calculated from Mathematical formula 10 to determine whether output voltage Vout is larger than a predetermined value (the predetermined low voltage (3.4 V/cell) to be corrected).

$$I_0 = (P\text{max} + P\text{step})/V\text{normal} \quad \text{(Mathematical formula 6)}$$

$$\Delta V_0 = I_0 \times R \quad \text{(Mathematical formula 7)}$$

$$I_k = (P\text{max} + P\text{step})/(V\text{normal} - \Delta V_{k-1}) \ (k=1,2,\ldots) \quad \text{(Mathematical formula 8)}$$

$$\Delta V_k = I_k \times R \ (k=1,2,\ldots,n) \quad \text{(Mathematical formula 9)}$$

$$V\text{out} = V\text{normal} - \Delta V_n \quad \text{(Mathematical formula 10)}$$

When output voltage Vout during the next peak discharge is determined to be larger than the predetermined value, the next peak discharge is controlled. For example, controller/operator 5 transmits the signal to mobile device 20 through communication processor 14 to set the peak discharge to Pmax+Pstep.

When output voltage Vout is determined to be larger than the predetermined value, the signal is transmitted such that the next peak discharge is performed with peak discharge power Pmax increased by one step.

The current and voltage at secondary battery 1 are detected with the current flowing in secondary battery 1, which allow internal resistance (R) of the battery to be calculated from Mathematical formula 11.

$$R = (E\text{ocv} - E\text{ccv})/I \quad \text{(Mathematical formula 11)}$$

Where Eocv is an unloaded voltage at the battery, Eccv is a battery voltage while current I is passed, and I is a current.

Since internal resistance R of the battery depends on the temperature and a degradation level, a function or a table identifying internal resistance R is stored, and internal resistance R of the battery can be obtained from the stored function or table.

Second Exemplary Embodiment

Figure 5:
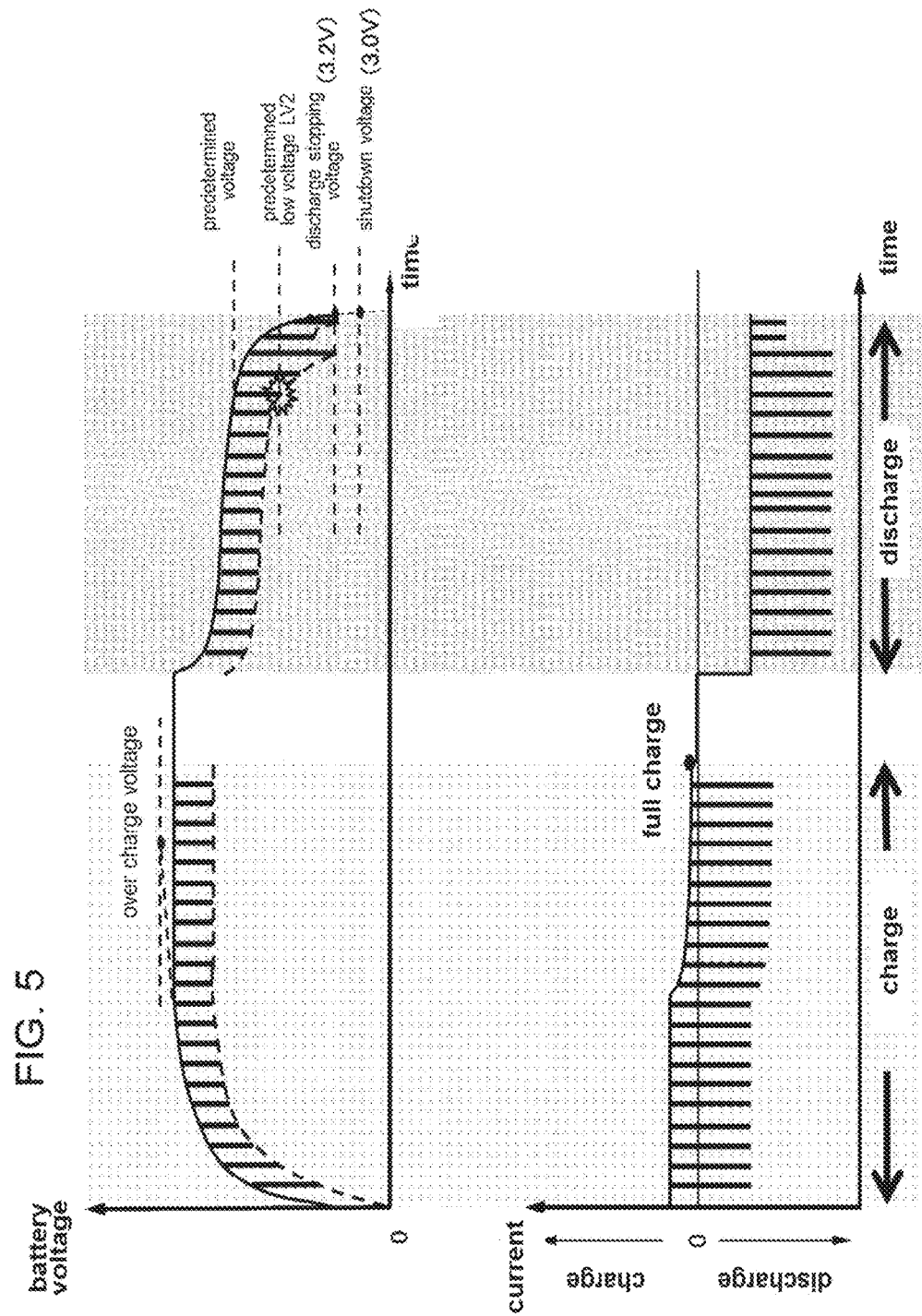
FIG. 5 is a view illustrating the voltage and the current during charging and discharge of the battery pack according to the second exemplary embodiment of the present invention.

In a second exemplary embodiment, the description of the same content as the first exemplary embodiment is omitted. The second exemplary embodiment is identical to the first exemplary embodiment in the configuration (FIG. 1) and the timing at which an A/D converted value is acquired (FIG. 2). The second exemplary embodiment differs from the first exemplary embodiment in the timing at which an A/D converted value is acquired (FIG. 3) and the voltage and current during the charging and discharge (FIG. 5).

In the second exemplary embodiment, the measurement and the detection in FIG. 3 are controlled as follows.

It is assumed that the pulse discharge exists in the case that the current value exceeds the predetermined threshold (for example, 2 C) when the current values are detected before and after the detection of the voltage at each parallel unit 2. Even if the voltage value of the secondary battery measured between the current values is less than or equal to the predetermined low voltage (3.4 V/cell) to be corrected, the discharge stopping voltage (predetermined value 3.2 V/cell), or the shutdown voltage (predetermined value 3.0 V/cell) of the microcomputer, the voltage value is not used, and the correction, the discharge stopping, and the shutdown are not performed.

As illustrated in FIG. 3(a), in the period of 250 ms, the voltage at each parallel unit 2 is continuously detected four times (about 0.5 ms/time), the temperature signal voltage is detected one time (about 0.5 ms/time), and the voltage corresponding to the current is detected the plurality of times (the voltage is continuously measured, for example, 128 times to calculate the average value for the measurement time of 16 ms).

As illustrated in FIGS. 3(b) and 3(c), when the pulse discharge is generated during the battery voltage measurement, although the pulse discharge voltage can be detected by the measurement of the battery voltage, the pulse discharge is ended to recover the current value during the current measurement. Therefore, the current cannot be measured and detected during the pulse discharge, and the control cannot properly be performed. At this point, in the pulse discharge, when the battery voltage is measured and detected without detecting the current, the voltage value of the secondary battery less than or equal to the predetermined low voltage (3.4 V/cell) to be corrected, the discharge stopping voltage (predetermined value 3.2 V/cell), or the shutdown voltage (predetermined value 3.0 V/cell) of the microcomputer is detected, and sometimes the control is falsely performed according to the detected voltage.

Referring to FIG. 5, in mobile device 20 driven by the power from battery pack 10, the voltage and the current are expressed during the charging and discharge when the CPU incorporated in mobile device 20 uses the function of instantaneously enhancing the processing speed.

The charge from the commercial power is eliminated after the full charging, and the PC is driven by the power from battery pack 10.

When the pulse discharge is performed during the discharge, it is undesirable that the voltage value at battery group 3 is less than or equal to the predetermined low voltage to be corrected. As illustrated in FIG. 5 (a horizontal axis indicates time and a vertical axis indicates the current and voltage), when the pulse discharge is performed at predetermined voltage (for example, 3.7 V) or less, the voltage value at battery group 3 becomes less than or equal to the predetermined low voltage LV2 to be corrected (3.4 V/cell). Therefore, when the voltage value at battery group 3 becomes a predetermined voltage (for example, 3.7 V) during the discharge, controller/operator 5 transmits the signal to the personal computer through communication processor 14, so that the personal computer can be notified that the voltage at the secondary battery is not suitable to the present pulse discharge.

The pulse discharge power can be decreased by the signal in electronic devices such as the personal computer.

INDUSTRIAL APPLICABILITY

In the battery pack and the method for controlling the discharge of the secondary battery of the present invention, the voltage at the secondary battery cell can be calculated and operated during the peak discharge power (pulse discharge). Since the voltage at the secondary battery cell is not decreased less than or equal to the predetermined low voltage to be corrected, the discharge stopping voltage, and the shutdown voltage during the pulse discharge power, the present invention is usefully applied to the battery pack that supplies the power to the electronic device improving instantaneously the processing speed with the peak discharge power higher than the power in the usual state and the method for controlling the discharge of the secondary battery.

The invention claims is:

1. A method for controlling discharge of a battery pack that supplies power to an electronic device, the electronic device improving instantaneously a processing speed with peak discharge power higher than power in a usual state, the method comprising:
   detecting a charging and discharging current value flowing in a battery group and a voltage value of the battery group in a time-division manner by switching between the current value and the voltage value using an electronic circuit, the battery group having a plurality of secondary batteries connected in series; and
   detecting current values before and after the voltage value of the battery group is detected, and determining, using a controller/operator included in the battery pack, that the voltage value of the battery group is influenced by the peak discharge power when at least one of the current values exceeds a predetermined threshold and the voltage value of the battery group is less than or equal to a predetermined voltage value,
   wherein the controller/operator includes a microcomputer that is shut down when the voltage value of the battery group is less than or equal to a shutdown voltage,
   wherein a voltage value Vnormal at the battery group in the usual state is measured,
   wherein an initial discharge current $I_0$ is calculated with a maximum peak discharge power Pmax and a predetermined power increase Pstep using an equation of $I_0=(Pmax+Pstep)/Vnormal$, and a voltage drop $\Delta V_0$ by an internal resistance R is calculated using an equation of $\Delta V_0 = I_0 \times R$,
   wherein a discharge current $I_k$ is calculated during the peak discharge power using an equation of $I_k = (Pmax+Pstep)/(Vnormal-\Delta V_{k-1})$ (where k=1, 2, . . . , n), and a voltage drop $\Delta V_k$ by the internal resistance R is calculated from the discharge current $I_k$ using an equation of $\Delta V_k = I_k \times R$, and
   wherein whether an output voltage value Vout (Vnormal−$\Delta$Vn) is larger than a predetermined value during nth-time peak discharge power is determined.

2. The method for controlling discharge of the battery pack according to claim 1, wherein the peak discharge power is increased when the output voltage value Vout is larger than the predetermined value.

3. A battery pack that supplies power to an electronic device, the electronic device improving instantaneously a processing speed with peak discharge power higher than power in a usual state, the battery pack comprising:
   a battery group in which a plurality of secondary batteries are connected in series;
   a detector that detects a charging and discharging current value flowing in the battery group and a voltage value of the battery group in a time-division manner by switching between the current value and the voltage value using an electronic circuit; and
   a controller/operator that performs operation and control using the current value and the voltage value detected by the detector,
   wherein the detector detects current values before and after the voltage value of the battery group is detected, and the controller/operator determines that the voltage value of the battery group is influenced by the peak discharge power when at least one of the current values exceeds a predetermined threshold and the voltage value of the battery group is less than or equal to a predetermined voltage value,
   wherein a voltage value Vnormal at the battery group in the usual state is measured,
   wherein an initial discharge current $I_0$ is calculated with a maximum peak discharge power Pmax and a predetermined power increase Pstep using an equation of $I_0=(Pmax+Pstep)/Vnormal$, and a voltage drop $\Delta V$ by an internal resistance R is calculated using an equation of $\Delta V_0 = I_0 \times R$,
   wherein a discharge current $I_k$ is calculated during the peak discharge power using an equation of $I_k=(Pmax+Pstep)/(Vnormal-\Delta V_{k-1})$ (where k=1, 2, . . . , n), and a voltage drop $\Delta V_k$ by the internal resistance R is calculated from the discharge current $I_k$ using an equation of $\Delta V_k = I_k \times R$, and
   wherein whether an output voltage value Vout (Vnormal−$\Delta$Vn) is larger than a predetermined value during nth-time peak discharge power is determined.

4. A method for controlling discharge of a battery pack that supplies power to an electronic device, the electronic device improving instantaneously a processing speed with peak discharge power higher than power in a usual state, the method comprising:
   detecting a charging and discharging current value flowing in a battery group and a voltage value of the battery group in a time-division manner by switching between the current value and the voltage value using an electronic circuit, the battery group having a plurality of secondary batteries connected in series; and detecting current values before and after the voltage value of the battery group is detected, and determining that the voltage value of the battery group is influenced by the peak discharge power when at least one of the current values exceeds a predetermined threshold and the voltage value of the battery group is less than or equal to a predetermined voltage value, wherein a voltage value Vnormal at the battery group in the usual state is measured, wherein an initial discharge current $I_0$ is calculated with a maximum peak discharge power Pmax and a predetermined power increase Pstep using an equation of $I_0=(Pmax+Pstep)/Vnormal$, and a voltage drop $\Delta V_0$ by an internal resistance R is calculated using an equation of $\Delta V_0 = I_0 \times R$, wherein a discharge current $I_k$ is calculated during the peak discharge power using an equation of $I_k=(Pmax+Pstep)/(Vnormal-\Delta V_{k-1})$ (where k=1, 2, ..., n), and a voltage drop $\Delta V_k$ by the internal resistance R is calculated from the discharge current $I_k$ using an equation of $\Delta V_k = I_k \times R$, and wherein whether an output voltage value Vout (Vnormal−$\Delta$Vn) is larger than a predetermined value during nth-time peak discharge power is determined.

* * * * *